US011728737B2

(12) United States Patent
Miatton et al.

(10) Patent No.: US 11,728,737 B2
(45) Date of Patent: Aug. 15, 2023

(54) PRE-CHARGE CIRCUITRY AND METHOD FOR ELECTRIC POWER CONVERTER

(71) Applicant: Infineon Technologies Austria AG, Villach (AT)

(72) Inventors: Daniele Miatton, Carbonara al Ticino (IT); Kyrylo Cherniak, Villach (AT); Hayri Verner Hasou, Sedriano (IT); Erwin Huber, Munich (DE); Sergio Morini, Pavia (IT); Volha Subotskaya, Villach (AT)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 0 days.

(21) Appl. No.: 17/026,250

(22) Filed: Sep. 20, 2020

(65) Prior Publication Data

US 2022/0094271 A1    Mar. 24, 2022

(51) Int. Cl.
*H02M 3/335* (2006.01)
*H02J 7/00* (2006.01)
*H02J 7/34* (2006.01)
*H03K 5/24* (2006.01)

(52) U.S. Cl.
CPC ....... *H02M 3/33569* (2013.01); *H02J 7/0068* (2013.01); *H03K 5/24* (2013.01); *H02J 7/345* (2013.01); *H02J 2207/50* (2020.01)

(58) Field of Classification Search
CPC ..... H02M 3/33569; H02J 7/0068; H02J 7/345
See application file for complete search history.

(56) References Cited

U.S. PATENT DOCUMENTS 7,365,585 B2 * 4/2008 Fort .................. H03K 5/01
326/29
10,181,804 B1 * 1/2019 Li ..................... H02M 7/4807
(Continued)

FOREIGN PATENT DOCUMENTS

WO    2019116722 A1    6/2019

OTHER PUBLICATIONS

European Search Report, from Corresponding European Application No. 21020450.9, dated Feb. 10, 2022, 11 pages.
(Continued)

*Primary Examiner* — Ryan Johnson
*Assistant Examiner* — Colleen J O Toole
(74) *Attorney, Agent, or Firm* — Cooper Legal Group, LLC

(57) ABSTRACT

An apparatus may include an electric power converter and pre-charge circuitry. The electric power converter may include a first circuit, a second circuit and an energy transfer device. The first circuit may be connected to a power supply. The second circuit may be connected to a load. The energy transfer device may have a first side connected to the first circuit and a second side connected to the second circuit. The pre-charge circuitry may be connected to a capacitor of the first circuit. The capacitor may be connected to the first side of the energy transfer device. The pre-charge circuitry may be configured to charge the capacitor during a pre-charge mode of the electric power converter. The electric power converter may be configured to exit the pre-charge mode and enter an energy transfer mode responsive to a charge level of the capacitor reaching a threshold pre-charge level.

20 Claims, 8 Drawing Sheets

(56) References Cited

U.S. PATENT DOCUMENTS 10,680,466 B2 * 6/2020 Liu .................. H01F 38/14
2021/0167690 A1 6/2021 Nakahara et al.

OTHER PUBLICATIONS

Jing Xue, et al., "A 2 MHz 12-100 V 90% tfficiency Self-Balancing ZVS Reconfigurable Three-Level DC-DC Regulator With Constant-Frequency Adaptive-On-Time V2 Control and Nanosecond-Scale ZVS Turn-On Delay", IEEE Journal of Solid-State Circuits, [Online] vol. 51, No. 12, Dec. 1, 2016, pp. 2854-2866.

* cited by examiner

ПРЕ-CHARGE CIRCUITRY AND METHOD FOR ELECTRIC POWER CONVERTER

TECHNICAL FIELD

The present disclosure relates to the field of electric power conversion.

BACKGROUND

Various types of devices may utilize electric power converters that convert one form of electric energy to another, such as by changing a voltage of the electric energy. Some electric power converters are open loop, where an input side of an electric power converter may not receive feedback from an output side of an electric power converter.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

In an embodiment, an apparatus is provided. The apparatus may comprise an electric power converter and pre-charge circuitry. The electric power converter may comprise a first circuit, a second circuit and an energy transfer device. The first circuit may be connected to a power supply. The second circuit may be connected to a load. The energy transfer device may have a first side connected to the first circuit and a second side connected to the second circuit. The pre-charge circuitry may be connected to a capacitor of the first circuit. The capacitor may be connected to the first side of the energy transfer device. The pre-charge circuitry may be configured to charge the capacitor during a pre-charge mode of the electric power converter. The electric power converter may be configured to exit the pre-charge mode and enter an energy transfer mode responsive to a charge level of the capacitor reaching a threshold pre-charge level.

In an embodiment, a method is provided. The method may comprise charging a capacitor of an electric power converter. The electric power converter may comprise an energy transfer device having a first side and a second side. The capacitor may be connected to the first side of the energy transfer device. The method may comprise operating, responsive to a charge level of the capacitor reaching a threshold pre-charge level, the electric power converter to transfer electrical energy from a first circuit connected to the first side of the energy transfer device to a second circuit connected to the second side of the energy transfer device.

In an embodiment, an apparatus is provided. The apparatus may comprise a means for charging a capacitor of an electric power converter, wherein the electric power converter comprises an energy transfer device having a first side and a second side, and the capacitor is connected to the first side of the energy transfer device. The apparatus may comprise a means for operating, responsive to a charge level of the capacitor reaching a threshold pre-charge level, the electric power converter to transfer electrical energy from a first circuit connected to the first side of the energy transfer device to a second circuit connected to the second side of the energy transfer device.

In an embodiment, an apparatus is provided. The apparatus may comprise a direct current (DC) to DC converter, a comparator and pre-charge circuitry. The DC to DC converter may comprise a first circuit, a second circuit and an energy transfer device. The first circuit may be connected to a power supply. The second circuit may be connected to a load. The energy transfer device may have a first side connected to the first circuit and a second side connected to the second circuit. The pre-charge circuitry may be connected to a capacitor of the first circuit. The capacitor may be connected to the first side of the energy transfer device. The pre-charge circuitry may comprise a current generator configured to supply a DC current, to the capacitor during a pre-charge mode of the DC to DC converter, to charge the capacitor. The comparator may have a first input corresponding to a charge level of the capacitor and a second input corresponding to a threshold pre-charge level. The comparator may be configured to trigger the DC to DC converter to exit the pre-charge mode responsive to the charge level of the capacitor reaching the threshold pre-charge level. The DC to DC converter may be configured to transfer electrical energy from the first circuit to the second circuit responsive to exiting the pre-charge mode.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

Figure 1:
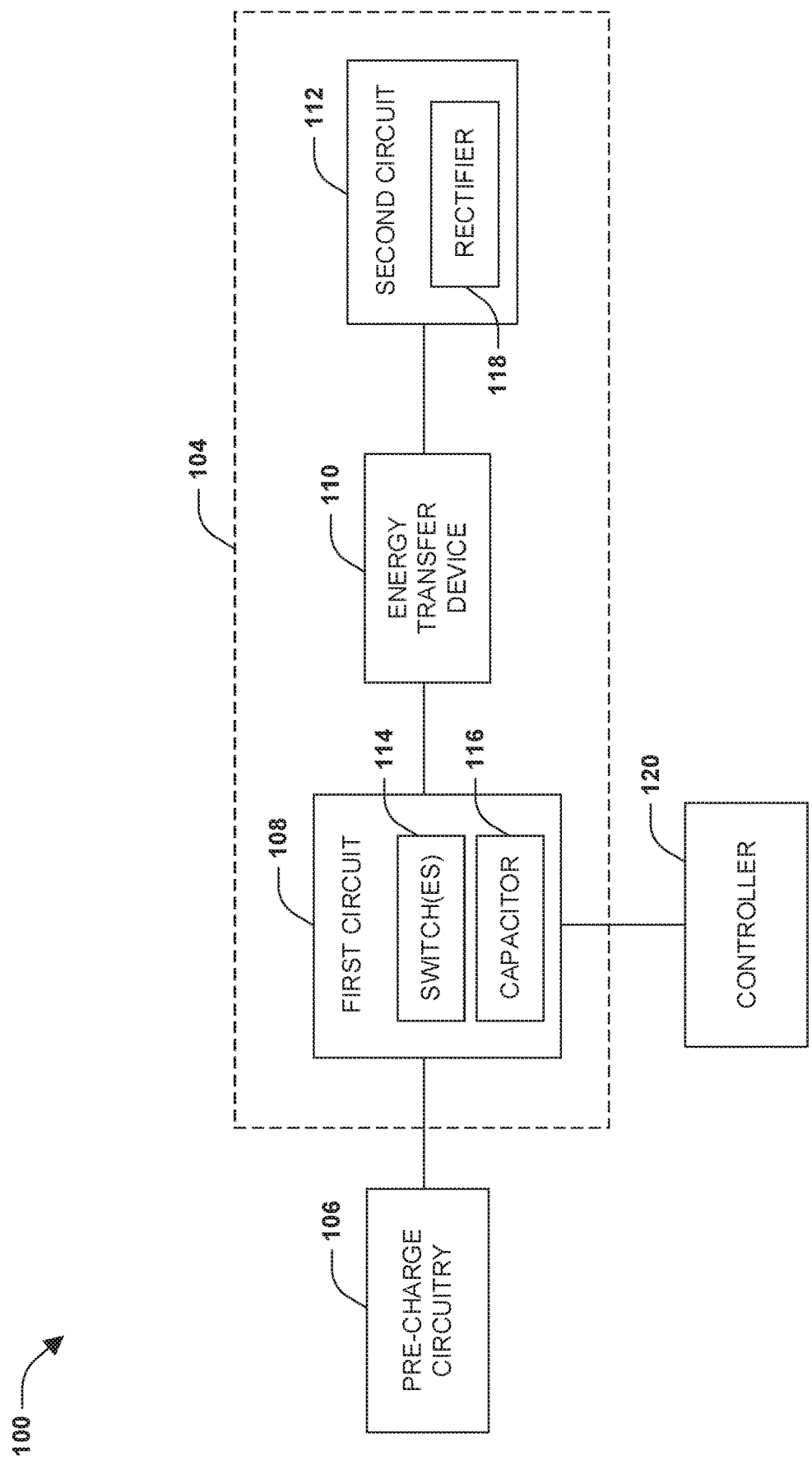
FIG. 1 is a component block diagram illustrating an exemplary apparatus with an electric power converter and pre-charge circuitry, according to some embodiments.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

Within the field of electronics, an electric power converter is used to convert one form of electric energy to another. The electric power converter may comprise an energy transfer device that provides isolation between a first side and a second side of the energy transfer device. The electric power converter may comprise a capacitor, connected to the first side of the energy transfer device, for inhibiting and/or preventing saturation of the energy transfer device. The techniques and apparatuses provided herein are capable of charging the capacitor prior to entering an energy transfer mode of the electric power converter (during which energy is transferred from the first side of the energy transfer device to the second side of the energy transfer device). Charging the capacitor prior to the energy transfer mode prevents and/or inhibits issues associated with the energy transfer mode, such as at least one of undershoot, overshoot, etc. of one or more outputs of the electric power converter.

In an embodiment, an apparatus, comprising an electric power converter and pre-charge circuitry, is provided. The electric power converter comprises an energy transfer device, such as a transformer. The energy transfer device has a first side, such as a primary side of the transformer, and a second side, such as a secondary side of the transformer. The electric power converter comprises a first circuit, such as a primary side control circuit of the electric power converter, connected to the first side of the energy transfer device, and a second circuit, such as a secondary side control circuit of the electric power converter, connected to the second side of the energy transfer device. In an embodiment, the first circuit is a full bridge circuit. In some embodiments, the energy transfer device comprises an isolation barrier between the first side and the second side, such as to provide electrical isolation between the first circuit and the second circuit. In some embodiments, the isolation barrier provides galvanic isolation between the first side and the second side of the energy transfer device.

The electric power converter is configured to transfer electrical energy from the first circuit to the second circuit during an energy transfer mode of the electric power converter. The apparatus may comprise a controller configured to operate one or more switches of the first circuit, according to a duty cycle and/or a frequency, to transfer the electrical energy from the first circuit to the second circuit during the energy transfer mode. In an embodiment, the one or more switches comprise one or more transistors, such as one or more metal-oxide-semiconductor field effect transistors (MOSFETs) (such as used where the electric power converter is implemented in an integrated circuit), one or more insulated-gate bipolar transistors (IGBTs) (such as used in discrete implementations of the electric power converter) and/or one or more other types of transistors. The first circuit is connected to a power supply, and the second circuit is connected to a load. In some embodiments, the electric power converter is a direct current (DC) to DC converter, where the power supply is a DC power supply and the electric power converter is configured to supply one or more DC voltages to the load during the energy transfer mode. In some embodiments, the load comprises a gate driver (e.g., an isolated gate driver), a switch (e.g., a power switch) and/or an inverter. In an embodiment, the one or more DC voltages are used by the gate driver to drive the switch. The one or more DC voltages may comprise a first DC voltage (e.g., a positive DC voltage) and a second DC voltage (e.g., a negative DC voltage). In an embodiment, the first DC voltage (e.g., the positive DC voltage) may be used to turn on (or off) the switch and/or the second DC voltage (e.g., the negative DC voltage) may be used to turn off (or on) the switch (e.g., the second DC voltage may be less than 0 volts, such as about −2 volts, such that the switch is turned off (or on) reliably and/or safely). In an embodiment, the electric power converter is an open loop electric power converter (e.g., the first circuit may not receive feedback from the second circuit).

The pre-charge circuitry is connected to a capacitor of the first circuit. The capacitor may be utilized for inhibiting and/or preventing transformer saturation (that may otherwise occur in some scenarios, such as where the duty cycle is less than a threshold, such as a duty cycle threshold of 50%). The capacitor is connected to the first side of the energy transfer device. In an embodiment, the capacitor is connected in series with the first side of the energy transfer device.

The pre-charge circuitry is configured to charge the capacitor during a pre-charge mode of the electric power converter. In an embodiment, the electric power converter enters the pre-charge mode upon start-up of the electric power converter. For example, when the electric power converter is activated, the electric power converter enters the pre-charge mode prior to entering the energy transfer mode. In an embodiment, the electric power converter does not enter the energy transfer mode while the electric power converter is in the pre-charge mode. For example, the electric power converter may enter the energy transfer mode after (and/or at the same time that) the electric power converter exits the pre-charge mode. In an embodiment, electrical energy (or more than a threshold amount of electrical energy) is not transferred from the first circuit to the second circuit during the pre-charge mode of the electric power converter. Alternatively and/or additionally, electrical activity in the first circuit and/or the pre-charge circuitry may not influence the second circuitry during the pre-charge mode of the electric power converter, such as at least due to the isolation barrier of the energy transfer device.

In an embodiment, the electric power converter is configured to exit the pre-charge mode and enter the energy transfer mode responsive to a charge level of the capacitor reaching a threshold pre-charge level. The charge level may correspond to a voltage level of the capacitor (e.g., a voltage drop across the capacitor). In an embodiment, the pre-charge circuitry is configured to monitor and/or sense a charge level of the capacitor. The pre-charge circuitry may be connected to the capacitor at a node, and may monitor and/or sense the charge level via the connection at the node. In an embodiment, the apparatus comprises a comparator with a first input corresponding to the charge level of the capacitor and a second input corresponding to the threshold pre-charge level. The comparator is configured to trigger the electric power converter to exit the pre-charge mode and enter the energy transfer mode responsive to the charge level of the capacitor reaching the threshold pre-charge level. In an embodiment, the first input may be a voltage sense input and the second input may be a threshold voltage input. The voltage sense input may be directly connected to the capacitor. Alternatively and/or additionally, one or more electronic components (such as one or more components of a voltage divider and/or other circuitry) may be connected between the capacitor and the voltage sense input. A threshold voltage level at the threshold voltage input may be generated by a threshold voltage selection module, such as comprising a voltage divider, a potentiometer, digital circuitry, and/or other circuitry. The threshold voltage level may be generated based upon the duty cycle, the frequency and/or a supply voltage of the power supply connected to the first circuit. In an embodiment, the threshold voltage selection module may have an input (such as a 4-bit bus) associated with the duty cycle and/or the frequency (e.g., the input may be indicative of the duty cycle, a value based upon the duty cycle, the frequency, and/or a value based upon the frequency). The threshold voltage selection module may generate the threshold voltage level based upon the input. In an embodiment, the threshold voltage selection module may determine a potentiometer resistance of a potentiometer based upon the input, and may control and/or adjust the potentiometer based upon the potentiometer resistance to generate the threshold voltage level. The threshold voltage selection module may dynamically adjust and/or switch the threshold voltage level based upon one or more factors, such as at least one of one or more operating conditions of the apparatus, a change to the duty cycle, a change to the frequency, etc. For example, the duty cycle (and/or the frequency) may be dynamically changed and the threshold voltage level may be adjusted based upon dynamic changes to the duty cycle (and/or the frequency). The comparator may trigger the electric power converter to exit the pre-charge mode and enter the energy transfer mode responsive to a voltage level at the voltage sense input reaching the threshold voltage level at the threshold voltage input, which may be reflective of the charge level of the capacitor reaching the threshold charge level. In an embodiment, the threshold charge level and/or the threshold voltage level correspond to at least a steady state level of the capacitor. In an embodiment, the threshold charge level and/or the threshold voltage level correspond to at least the supply voltage of the power supply. The supply voltage may correspond to a voltage difference between a positive terminal of the power supply and a negative terminal of the power supply. Alternatively and/or additionally, the threshold charge level and/or the threshold voltage level may correspond to less than the supply voltage of the power supply. In an embodiment, the threshold charge level and/or the threshold voltage level correspond to about $V \times (1-2D)$, where V corresponds to the supply voltage of the power supply, and D corresponds to the duty cycle.

In an embodiment, the electric power converter is configured to exit the pre-charge mode and enter the energy transfer mode responsive to a pre-charge time reaching a threshold pre-charge time. The pre-charge time corresponds to a duration of time that the electric power converter is in the pre-charge mode. In an example, the threshold pre-charge time may correspond to a required duration of the pre-charge mode for the charge level of the capacitor to reach a desired charge level (e.g., the threshold pre-charge level). Alternatively and/or additionally, the threshold pre-charge time may be greater than the required duration (e.g., the charge level of the capacitor may reach a desired charge level before expiration of the threshold pre-charge time). The threshold pre-charge time may be based upon the duty cycle, the frequency, the supply voltage of the power supply and/or a capacitance of the capacitor. In an example, the threshold pre-charge time may be about 10 milliseconds (e.g., it may be determined that the charge level of the capacitor reaches the threshold pre-charge level when the pre-charge time of the pre-charge mode reaches 10 milliseconds). In the example, the electric power converter may enter the pre-charge mode at 0 milliseconds, and exit the pre-charge mode and enter the energy transfer mode at about 10 milliseconds based upon the pre-charge time reaching the threshold pre-charge time. In an embodiment, the pre-charge circuitry comprises a timer (and/or a clock) that is activated when the electric power converter enters the pre-charge mode (e.g., upon start-up of the electric power converter). The timer (and/or the clock) may trigger the electric power converter to exit the pre-charge mode and enter the energy transfer mode responsive to the pre-charge time reaching the threshold pre-charge time.

In an embodiment, the electric power converter is configured to exit the pre-charge mode and enter the energy transfer mode responsive to the pre-charge time reaching a maximum pre-charge time (such as 20 milliseconds or a different amount of time based upon system requirements). Responsive to the pre-charge time reaching the maximum pre-charge time, the electric power converter may be triggered to exit the pre-charge mode and enter the energy transfer mode regardless of whether the charge level of the capacitor meets the threshold pre-charge level.

In an embodiment, the pre-charge circuitry comprises a current generator to charge the capacitor. The current generator is configured to supply a current to the capacitor during the pre-charge mode of the electric power converter. The current may be a DC current. In an embodiment, the current generator is configured to stop supplying the current to the capacitor responsive to the electric power converter exiting the pre-charge mode and/or entering the energy transfer mode. For example, the current generator may be configured to stop supplying the current to the capacitor responsive to the charge level of the capacitor reaching the threshold pre-charge level. Alternatively and/or additionally, the current generator may be configured to stop supplying the current to the capacitor responsive to the pre-charge time reaching the threshold pre-charge time or the maximum pre-charge time. In an embodiment, the apparatus comprises a switch connected to the current generator. For example, the switch may be connected between the current generator and the capacitor. Alternatively and/or additionally, the switch may be connected between the current generator and the voltage supply (e.g., the positive terminal of the power supply). The switch may be closed when the electric power converter is in the pre-charge mode, thus enabling the current generator to supply the current to the capacitor during the pre-charge mode. The switch may be open when the electric power converter is not in the pre-charge mode (e.g., when the electric power converter is in the energy transfer mode).

In an embodiment, the pre-charge circuitry comprises a resistor (e.g., a pull up resistor) to charge the capacitor. The resistor may be connected between the capacitor and the power supply (e.g., a first terminal of the resistor may be connected to the capacitor and a second terminal of the resistor may be connected to the power supply). Electrical energy from the power supply is supplied to the capacitor via the resistor during the pre-charge mode of the electric power converter.

In an embodiment, the pre-charge circuitry comprises a voltage divider to charge the capacitor. The voltage divider may be connected to the power supply (e.g., the voltage divider may be connected to the positive terminal of the power supply and/or the negative terminal of the power supply). An output of the voltage divider may be connected to the capacitor. Electrical energy from the power supply is supplied to the capacitor via the voltage divider during the pre-charge mode of the electric power converter.

In an embodiment, the pre-charge circuitry comprises and/or is configured to utilize a voltage regulator to charge the capacitor. The voltage regulator may be connected between the capacitor and the power supply. Electrical energy from the power supply is supplied to the capacitor via the voltage regulator during the pre-charge mode of the electric power converter. In an embodiment, electrical energy stops being supplied to the capacitor via the voltage regulator responsive to the electric power converter exiting the pre-charge mode and/or entering the energy transfer mode. For example, electrical energy may stop being supplied to the capacitor via the voltage regulator responsive to the charge level of the capacitor reaching the threshold pre-charge level. Alternatively and/or additionally, electrical energy may stop being supplied to the capacitor via the voltage regulator responsive to the pre-charge time reaching the threshold pre-charge time or the maximum pre-charge time. In an embodiment, the voltage regulator acts as a switch connected between the capacitor and the power supply. The voltage regulator may allow electrical energy from the power supply to be supplied to the capacitor when the electric power converter is in the pre-charge mode. In an embodiment, the voltage regulator corresponds to a switch of the one or more switches of the first circuit, and, when the electric power converter is in the energy transfer mode, the voltage regulator (e.g., the switch of the one or more switches) may be operated (e.g., switched on and off) by the controller to transfer electrical energy from the first circuit to the second circuit.

FIG. 1 illustrates an apparatus 100 according to some embodiments. The apparatus 100 comprises an electric power converter 104, pre-charge circuitry 106 and/or a controller 120. The electric power converter 104 comprises an energy transfer device 110, such as a transformer. The energy transfer device 110 has a first side (e.g., a primary side of the transformer) and a second side (e.g., a secondary side of the transformer). The electric power converter 104 comprises a first circuit 108, such as a primary side control circuit of the electric power converter 104, connected to the first side of the energy transfer device 110. The electric power converter 104 comprises a second circuit 112, such as a secondary side control circuit of the electric power converter 104, connected to the second side of the energy transfer device 110. In some embodiments, the energy transfer device 110 comprises an isolation barrier between the first side and the second side of the energy transfer device 110, such as to provide electrical isolation between the first circuit 108 and the second circuit 112. In some embodiments, the isolation barrier provides galvanic isolation between the first side and the second side of the energy transfer device 110.

In some embodiments, the first circuit 108 comprises one or more switches 114 and/or a capacitor 116. The one or more switches 114 of the first circuit 108 may be operated, according to a duty cycle and/or a frequency, to transfer electrical energy from the first circuit 108 to the second circuit 112 during an energy transfer mode of the electric power converter 104. In some embodiments, the controller 120 is connected to the first circuit 108. The controller 120 may be configured to operate the one or more switches 114 of the first circuit 108 during the energy transfer mode. The first circuit 108 may be connected to a power supply, and the second circuit 112 may be connected to a load. In some embodiments, the electric power converter 104 is a DC to DC converter, where the power supply is a DC power supply and/or the electric power converter 104 is configured to supply one or more DC voltages to the load during the energy transfer mode. In an embodiment, the second circuit 112 comprises a rectifier 118, such as a push pull rectifier, to generate the one or more DC voltages.

In some embodiments, the pre-charge circuitry 106 is connected to the capacitor 116. The capacitor 116 may be utilized for inhibiting and/or preventing saturation of the energy transfer device 110 (that may otherwise occur if the duty cycle exceeds a threshold, such as 50%). The capacitor 116 is connected to the first side of the energy transfer device 110. In some embodiments, the capacitor 116 is connected in series with the first side of the energy transfer device 110 (such as shown in FIGS. 2-3 and 5-7).

The pre-charge circuitry 106 is configured to charge the capacitor 116 during a pre-charge mode of the electric power converter 104. In an embodiment, the electric power converter 104 enters the pre-charge mode upon start-up of the electric power converter 104. In an embodiment, the electric power converter 104 does not enter the energy transfer mode while the electric power converter 104 is in the pre-charge mode. The electric power converter 104 may enter the energy transfer mode after (and/or at the same time that) the electric power converter 104 exits the pre-charge mode. In some embodiments, the controller 120 is connected to the pre-charge circuitry 106. The controller 120 may be configured to control at least some components of the pre-charge circuitry 106 and/or the first circuit 108 to charge the capacitor 116 during the pre-charge mode of the electric power converter 104.

In some embodiments, the electric power converter 104 is configured to exit the pre-charge mode and/or enter the energy transfer mode responsive to a charge level of the capacitor 116 reaching a threshold pre-charge level. In some embodiments, the electric power converter 104 is configured to exit the pre-charge mode and enter the energy transfer mode responsive to a pre-charge time reaching a threshold pre-charge time or a maximum pre-charge time. The pre-charge time corresponds to a duration of time that the electric power converter 104 is in the pre-charge mode.

Figure 2:
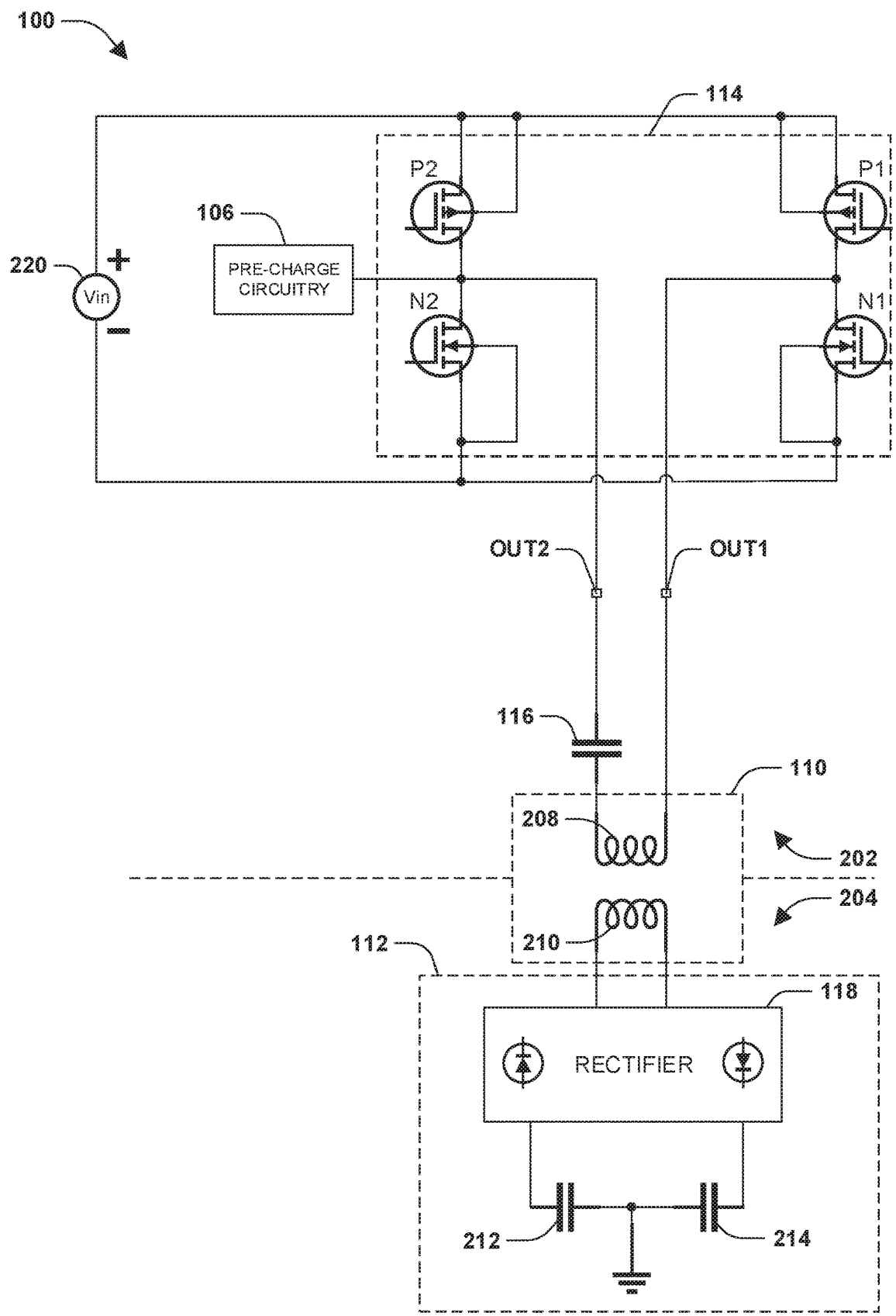
FIG. 2 is a component block diagram illustrating an exemplary apparatus with an electric power converter and pre-charge circuitry, according to some embodiments.

FIG. 2 illustrates the apparatus 100 according to some embodiments. The one or more switches 114 shown in FIG. 2 comprise MOSFET transistors, such as p-type MOSFET transistors P1 and P2 and n-type MOSFET transistors N1 and N2. Although FIGS. 2-3 and 5-7 illustrate implementations where the one or more switches 114 are four MOSFET transistors, it may be appreciated that implementations with other types of switches and/or other amounts of switches can be employed by the apparatus 100 for performance of operations and/or techniques that are described herein with respect to the one or more switches 114. The energy transfer device 110 shown in FIG. 2 comprises a transformer having a primary side 208 and a secondary side 210. In some embodiments, the transformer comprises an isolation barrier between the primary side 208 and the secondary side 210, such as to provide electrical isolation (e.g., galvanic isolation) between a first side 202 of the apparatus 100 and a second side 204 of the apparatus 100.

The first side 202 of the apparatus 100 may be connected to (and/or may comprise) a power supply 220, such as a DC power supply 220 having a positive terminal and a negative terminal. The one or more switches 114 of the first circuit 108 may be operated, according to the duty cycle and/or the frequency, to transfer electrical energy from the first side 202 of the apparatus 100 to the second side 204 of the apparatus 100. The controller 120 of the apparatus 100 may operate the one or more switches 114 to drive the primary side 208 of the transformer in a push and pull manner. For example, the controller 120 may operate the one or more switches 114 to perform switching cycles for transferring energy through the energy transfer device 110 to the second side 204 of the apparatus 100.

During a first phase of a switching cycle, the P1 transistor and the N2 transistor may be in on-state, the P2 transistor and the N1 transistor may be in off-state, and/or an input current (e.g., current from the power supply 220) flows from a first terminal of the primary side 208 of the transformer (e.g., a terminal of the transformer that is connected to the P1 transistor) to a second terminal of the primary side 208 of the transformer (e.g., a terminal of the transformer that is connected to the capacitor 116). During the first phase of the switching cycle, a second capacitor 214 is charged through the rectifier 118. During the first phase of the switching cycle, a voltage level at a node OUT1 may correspond to a positive supply voltage of the positive terminal of the power supply 220 (e.g., the voltage level at the node OUT1 may correspond to at least one of Vdd, Vcc, etc.) and a voltage level at a node OUT2 may correspond to a negative supply voltage of the negative terminal of the power supply 220 (e.g., the voltage level at the node OUT2 may correspond to at least one of ground, Vss, Vee, etc.).

During a second phase of the switching cycle, the P2 transistor and the N1 transistor may be in on-state, the P1 transistor and the N2 transistor may be in off-state, and an input current flows from the second terminal of the primary side 208 of the transformer to the first terminal of the primary side 208 of the transformer. During the second phase of the switching cycle, a third capacitor 212 is charged through the rectifier 118. In some embodiments, the rectifier 118 is a push pull rectifier. During the second phase of the switching cycle, the voltage level at the node OUT1 may correspond to the negative supply voltage of the negative terminal of the power supply 220 (e.g., the voltage level at the node OUT1 may correspond to at least one of ground, Vss, Vee, etc.) and the voltage level at the node OUT2 may correspond to the positive supply voltage of the positive terminal of the power supply 220 (e.g., the voltage level at the node OUT2 may correspond to at least one of Vdd, Vcc, etc.).

The one or more DC voltages output by the apparatus 100 may comprise a first DC voltage (e.g., a positive DC voltage) across the second capacitor 214 and a second DC voltage (e.g., a negative DC voltage) across the third capacitor 212. In some embodiments, the switching cycles are performed according to the frequency (e.g., the frequency is a switching frequency at which the switching cycles are performed) and/or the duty cycle. The duty cycle may correspond to a ratio between a duration of the first phase of a switching cycle and a duration of the switching cycle (e.g., the duty cycle may be equal to a product of the duration of the first phase and the frequency). In some embodiments, the duty cycle is between about 10% to about 30%. In an embodiment where the duty cycle is 30%, the duration of the first phase of the switching cycle may be equal to about 30% of the duration of the switching cycle. In some embodiments, the one or more DC voltages output by the apparatus 100 may be controlled by controlling the duty cycle. For example, the duty cycle may be set to obtain one or more desired voltage levels of the one or more DC voltages. Alternatively and/or additionally, the one or more DC voltages output by the apparatus 100 may be controlled by controlling the frequency. For example, the frequency may be set to obtain one or more desired voltage levels of the one or more DC voltages. Alternatively and/or additionally, the frequency with which the controller 120 operates the one or more switches 114 may have frequency variations (e.g., changes in the frequency over time) to obtain one or more desired voltage levels of the one or more DC voltages (e.g., the controller 120 may operate the one or more switches 114 such that the frequency of switching cycles changes over time in order to obtain the one or more DC voltages).

In some embodiments, the first DC voltage across the second capacitor 214 (e.g., the positive DC voltage) may be equal to about $N \times (V+V_C)$, where V corresponds to a supply voltage of the power supply 220 (e.g., the supply voltage may correspond to a voltage difference between the positive terminal of the power supply 220 and a negative terminal of the power supply 220), $V_C$ corresponds to a voltage across the capacitor 116, and N is associated with a turns ratio of the transformer. For example, N may correspond to a number of turns of the secondary side 210 (e.g., a number of turns of a secondary coil of the transformer) divided by a number of turns of the primary side 208 (e.g., a number of turns of a primary coil of the transformer). In some embodiments, the second DC voltage across the third capacitor 212 (e.g., the negative DC voltage) may be equal to about $N \times (V-V_C)$. At start-up of the electric power converter 104, the capacitor 116 may not be charged and thus $V_C$ may be 0 and/or less than a steady state voltage of the capacitor 116 (e.g., the steady state voltage may correspond to $V \times (1-2D)$, where D corresponds to the duty cycle). Accordingly, if the electric power converter 104 enters the energy transfer mode (e.g., operates the one or more switches 114 to transfer electrical energy from the first side 202 to the second side 204 of the apparatus 100) without charging the capacitor 116 beforehand, the first DC voltage and/or the second DC voltage may be unregulated for a period of time, such as due to the charge level of the capacitor 116 changing over time after start-up. Entering the energy transfer mode without charging the capacitor 116 beforehand leads to issues, such as at least one of undershoot of the first DC voltage and/or the second DC voltage, overshoot of the first DC voltage and/or the second DC voltage, etc. In an example where the electric power converter 104 is configured to output the second DC voltage (e.g., the negative DC voltage) at −2 volts, entering the energy transfer mode without charging the capacitor 116 beforehand causes heavy overshoot of the second DC voltage (such as to −7 volts) after start-up of the electric power converter 104, which can cause damage to the load to which the second DC voltage is supplied (e.g., the load may be at least one of a gate driver, a power switch, etc.). The pre-charge circuitry 106 charges the capacitor 116 prior to entering the energy transfer mode, thereby preventing and/or inhibiting the aforementioned issues, such as at least one of undershoot of the first DC voltage and/or the second DC voltage, overshoot of the first DC voltage and/or the second DC voltage, etc. Some systems attempt to prevent and/or inhibit such voltage undershoot and/or overshoot by employing discrete and/or external components, such as Zener diodes. However, such components are costly and require a large amount of space (e.g., more space than the pre-charge circuitry 106 requires), thereby increasing the cost and volume of corresponding devices. Furthermore, Zener diodes are unreliable in some scenarios, such as scenarios in which the first DC voltage and the second DC voltage are highly asymmetrical (e.g., asymmetry between the first DC voltage and the second voltage exceeds a threshold) and/or at least one of the first DC voltage or the second DC voltage is less than a threshold voltage (e.g., 3 volts). The unreliability may be due at least to a low accuracy of a clamping voltage associated with a Zener diode. Accordingly, by using the pre-charge circuitry 106 in accordance with one or more of the techniques presented herein, the aforementioned issues may be inhibited and/or prevented more reliably using smaller and/or less expensive components.

Figure 3:
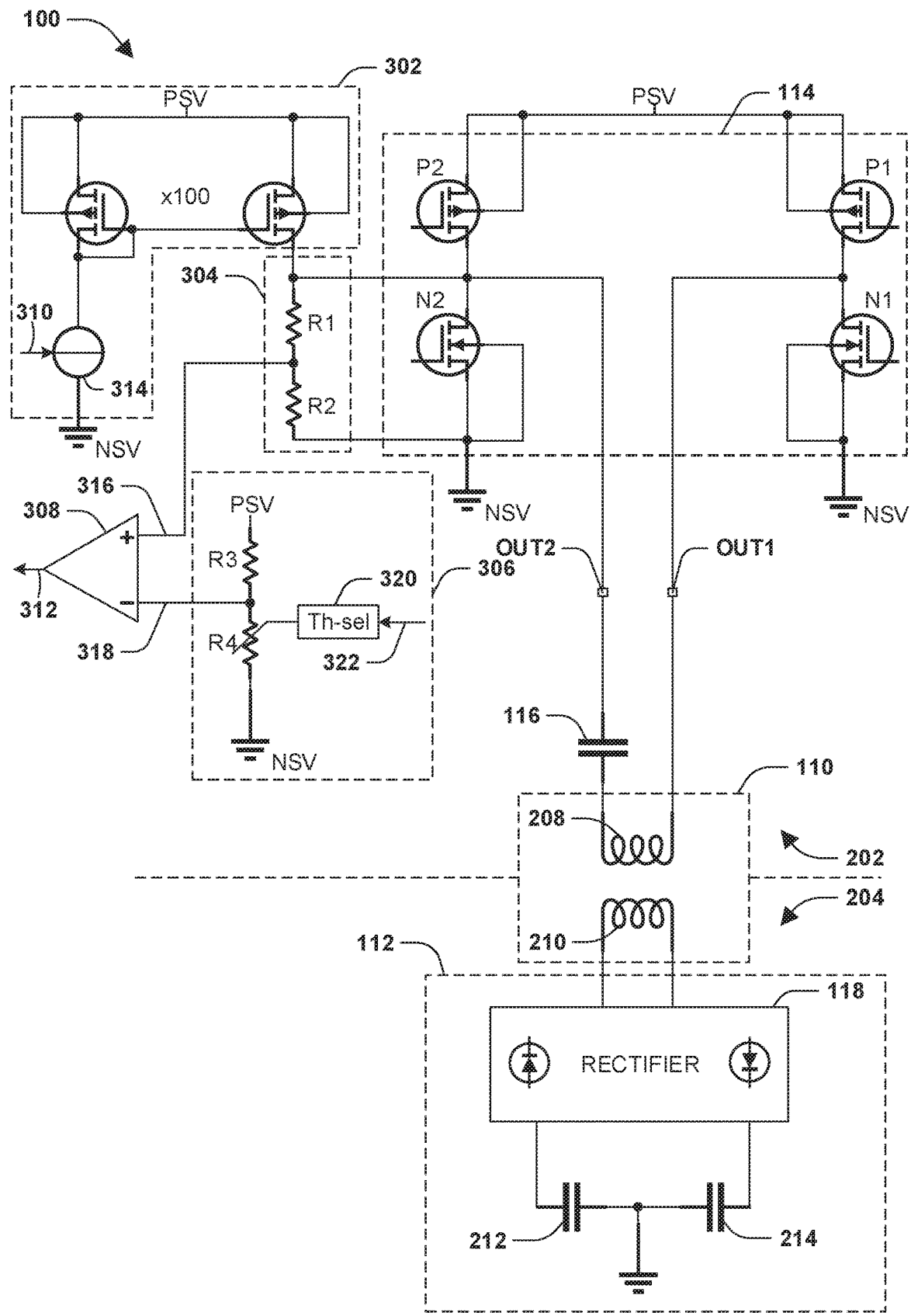
FIG. 3 is a component block diagram illustrating an exemplary apparatus with an electric power converter and pre-charge circuitry comprising a current generator, according to some embodiments.

FIG. 3 illustrates the apparatus 100 according to some embodiments where the pre-charge circuitry 106 comprises a current generator 302. Nodes labeled "PSV" (Positive Supply Voltage) in FIG. 3 and FIGS. 5-6 may be connected to the positive terminal of the power supply 220 (e.g., PSV may correspond to at least one of Vdd, Vcc, etc.). Nodes labeled "NSV" (Negative Supply Voltage) in FIG. 3 and FIGS. 5-6 may be connected to the negative terminal of the power supply 220 (e.g., NSV may correspond to at least one of ground, Vss, Vee, etc.). The supply voltage V of the power supply 220 may be a voltage at a PSV node (connected to the positive terminal) minus a voltage at a NSV node (connected to the negative terminal). In an example where the voltage at the NSV node is 0 volts, the supply voltage V of the power supply 220 may correspond to the voltage at the PSV node.

In some embodiments, the current generator 302 may supply a charging current to the capacitor 116 during the pre-charge mode of the electric power converter 104. The charging current may be a DC current and/or a constant current. In some embodiments, the current generator 302 comprises a current source 314 configured to supply a current to other circuitry of the current generator 302, where the other circuitry outputs the charging current to be supplied to the capacitor 116 (e.g., the charging current may be greater than the current supplied by the current source 314, such as 100 times the current supplied by the current source 314). In some embodiments, the other circuitry may comprise a current mirror circuit, such as comprising transistors as shown in FIG. 3, configured to mirror the current supplied by the current source 314 in an x:1 ratio to generate the charging current, where x is based upon a configuration of the current mirror circuit. The current generator 302 may be connected to the capacitor 116 (e.g., the current generator 302 may be connected to a top terminal of the capacitor 116 that is opposite a bottom terminal of the capacitor 116 that is connected to the primary side 208 of the transformer) and the current generator 302 may supply the charging current to the capacitor 116 via the connection. The current source 314 may have an input 310 corresponding to an enable pre-charge signal, such as indicative of whether the pre-charge mode of the electric power converter 104 is enabled (e.g., whether the electric power converter 104 is in the pre-charge mode). In some embodiments, the controller 120 may generate the enable pre-charge signal and/or may control the current source 314 via the input 310. The current source 314 may supply the current (and/or the current generator 302 may supply the charging current) when the pre-charge mode is enabled. The N1 transistor of the one or more switches 114 may be in on-state (e.g., closed) when the pre-charge mode is enabled to allow the charging current to be supplied to and charge the capacitor 116. In some embodiments, the current source 314 may not supply the current (and/or the current generator 302 may not supply the charging current) when the pre-charge mode is not enabled.

It may be appreciated that using the current generator 302 and/or the current source 314 to charge the capacitor 116 with controlled current (e.g., DC current and/or constant current) may inhibit and/or prevent some transformer effects (e.g., leakage inductance, magnetizing inductance, ringing between the leakage inductance and series capacitance of the capacitor 116, etc.) during the pre-charge mode (e.g., the primary side 208 of the transformer may act as (and/or substantially as) a short circuit during the pre-charge mode).

In some embodiments, the apparatus 100 comprises a comparator 308. The comparator 308 may be used to monitor and/or sense the charge level of the capacitor 116 (e.g., a voltage level of the capacitor 116). The comparator 308 may have a voltage sense input 316 corresponding to the charge level of the capacitor 116 and a threshold voltage input 318 corresponding to the threshold pre-charge level. The voltage sense input 316 may be connected to the capacitor 116 (e.g., the top terminal of the capacitor 116) via a voltage divider 304, such as comprising a resistor R1, a resistor R2 and/or one or more other electronic components. In some embodiments, a resistance of the resistor R1 is larger than a resistance of the resistor R2. For example, the resistance of the resistor R1 may be about 7.5 (or other value) times the resistance of the resistor R2. In some embodiments, the threshold voltage input 318 may be connected to a threshold voltage selection module 306, such as comprising a threshold voltage selection controller 320, a voltage divider and/or one or more other electronic components. The voltage divider of the threshold voltage selection module 306 may comprise a resistor R3, a potentiometer R4 (e.g., a variable resistor) and/or one or more other electronic components. In some embodiments, a resistance of the resistor R3 is larger than a resistance (e.g., a maximum resistance) of the potentiometer R4. For example, the resistance of the resistor R3 may be about 7.5 (or other value) times the resistance (e.g., the maximum resistance) of the potentiometer R4. In an embodiment, the threshold voltage selection controller 320 may have an input 322 (such as a 4-bit bus) associated with the duty cycle and/or the frequency (e.g., the input 322 may be indicative of the duty cycle, a value based upon the duty cycle, the frequency, and/or a value based upon the frequency). The threshold voltage selection controller 320 may control the potentiometer R4 and/or set a threshold voltage level at the threshold voltage input 318 based upon the input 322. In an embodiment, the threshold voltage selection controller 320 may determine a potentiometer resistance of the potentiometer R4 based upon the input 322, and may control and/or adjust the potentiometer R4 to generate the threshold voltage level at the threshold voltage input 318. In some embodiments, the comparator 308 may trigger the electric power converter 104 to exit the pre-charge mode and/or enter the energy transfer mode responsive to a voltage level at the voltage sense input 316 reaching the threshold voltage level at the threshold voltage input 318, which is reflective of the charge level of the capacitor 116 reaching the threshold charge level. In some embodiments, the comparator 308 has an output 312 indicative of whether the voltage level at the voltage sense input 316 meets the threshold voltage level at the threshold voltage input 318. For example, the comparator 308 may compare the voltage level at the voltage sense input 316 with the threshold voltage level at the threshold voltage input 318 and generate a pre-charge status signal at the output 312 indicating whether the voltage level at the voltage sense input 316 meets the threshold voltage level at the threshold voltage input 318.

In some embodiments, the controller 120 may be connected to the output 312 of the comparator 308. Responsive to the pre-charge status signal indicating that the voltage level at the voltage sense input 316 meets the threshold voltage level at the threshold voltage input 318, the controller 120 may trigger the electric power converter 104 to exit the pre-charge mode and/or enter the energy transfer mode (e.g., the controller 120 may operate the one or more switches 114 to perform switching cycles). Alternatively and/or additionally, responsive to the pre-charge status signal indicating that the voltage level at the voltage sense input 316 meets the threshold voltage level at the threshold voltage input 318, the controller 120 may deactivate the current generator 302 (e.g., the controller 120 may trigger the current generator 302 to stop supplying the charging current to the capacitor 116). For example, the controller 120 may control the current generator 302 via the input 310 of the current source 314.

In some embodiments, the comparator 308 may have a third input (not shown) corresponding to a signal (e.g., the enable pre-charge signal and/or a different signal) indicating whether the pre-charge mode of the electric power converter 104 is enabled. The comparator 308 may perform the comparing based upon the signal, such as by performing the comparing during the pre-charge mode and/or not performing the comparing during the energy transfer mode. In some examples, the controller 120 may control the comparator 308 via the third input (e.g., the controller 120 may activate and/or deactivate the comparator 308 via the third input).

Alternatively and/or additionally, the controller 120 may be connected to (and/or may comprise) a timer. The controller 120 may utilize the timer to determine if the pre-charge time reaches the threshold pre-charge time or the maximum pre-charge time. Responsive to the pre-charge time reaching the threshold pre-charge time or the maximum pre-charge time, the controller 120 may trigger the electric power converter 104 to exit the pre-charge mode and enter the energy transfer mode (e.g., the controller 120 may operate the one or more switches 114 to perform switching cycles). Alternatively and/or additionally, responsive to the pre-charge time reaching the threshold pre-charge time or the maximum pre-charge time, the controller 120 may deactivate the current generator 302 (e.g., the controller 120 may trigger the current generator 302 to stop supplying the charging current to the capacitor 116).

Figure 4:
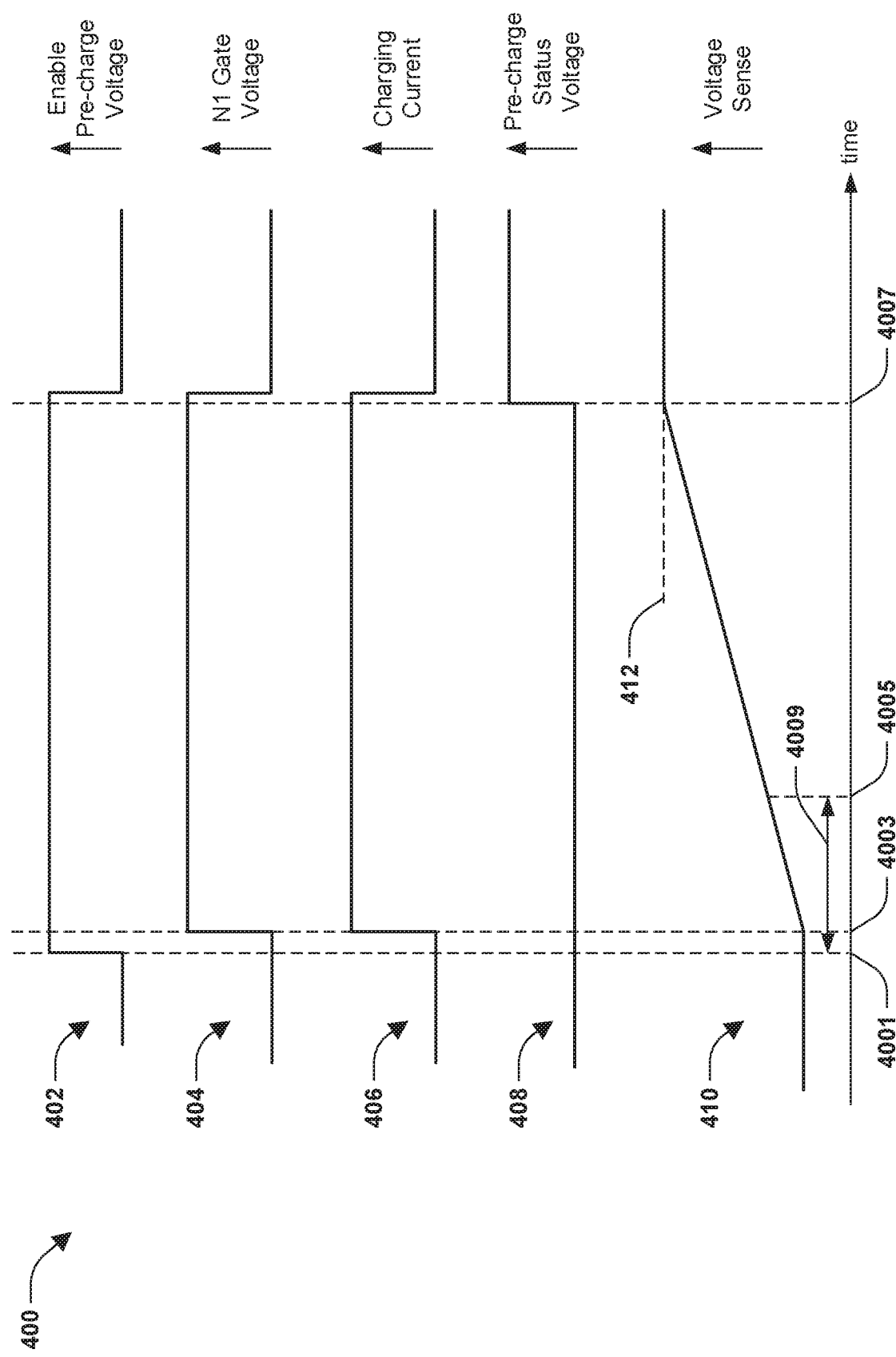
FIG. 4 is a chart illustrating an exemplary timing diagram associated with operation of an apparatus, according to some embodiments.

FIG. 4 illustrates a timing diagram 400 associated with operation of the apparatus 100, according to some embodiments. The timing diagram 400 comprises an enable pre-charge signal curve 402, an N1 gate curve 404, a charging current curve 406, a pre-charge status signal curve 408 and a voltage sense curve 410. A horizontal axis of the timing diagram 400 may correspond to time. A vertical axis of the enable pre-charge signal curve 402 may correspond to a voltage level of the enable pre-charge signal (at the input 310 of the current source 314 and/or at the third input of the comparator 308). A vertical axis of the N1 gate curve 404 may correspond to a voltage level at a gate of the N1 transistor. A vertical axis of the charging current curve 406 may correspond to a current level of the charging current that is supplied by the current generator 302 to charge the capacitor 116. A vertical axis of the pre-charge status signal curve 408 may correspond to a voltage level of the pre-charge status signal (at the output 312 of the comparator 308). A vertical axis of the voltage sense curve 410 may correspond to a voltage level at the voltage sense input 316.

As shown by the enable pre-charge signal curve 402, a voltage level of the enable pre-charge signal may increase (e.g., from a low signal level to a high signal level) at a first time 4001. The voltage level of the enable pre-charge signal may increase responsive to start-up of the apparatus 100 and/or the electric power converter 104. In an embodiment, the enable pre-charge signal may be generated and/or controlled by the controller 120 of the apparatus 100. The voltage level of the enable pre-charge signal increasing (e.g., from the low signal level to the high signal level) may indicate that the pre-charge mode of the electric power converter 104 is enabled and/or may trigger the pre-charge mode to start.

As shown by the N1 gate curve 404 and the charging current curve 406, the voltage level at the gate of the N1 transistor may increase (such as to activate the N1 transistor) at a second time 4003 and/or the charging current supplied by the current generator 302 may increase at the second time 4003. The voltage level at the gate of the N1 transistor and/or the charging current supplied by the current generator 302 may increase responsive to the enable pre-charge signal increasing at the first time 4001. The N1 transistor may be in off-state (e.g., opened) prior to the second time 4003. The N1 transistor may be in on-state (e.g., closed) at and/or after the second time 4003, such as to allow the charging current to be supplied to and charge the capacitor 116. The charging current may be about 0 amperes prior to the second time 4003. The charging current may be at a constant current level at and/or after the second time 4003.

As shown by the voltage sense curve 410, the voltage level at the voltage sense input 316, which is reflective of the charge level of the capacitor 116, may begin increasing at and/or after the second time 4003, such as due to the N1 transistor entering the on-state and/or the current generator 302 supplying the charging current to charge the capacitor 116. In some embodiments, the comparator 308 may begin comparing the voltage level at the voltage sense input 316 with the threshold voltage level at the threshold voltage input 318 at the first time 4001 and/or prior to the second time 4003. Alternatively and/or additionally, the comparator 308 may begin comparing the voltage level with the threshold voltage level at the second time 4003. Alternatively and/or additionally, the comparator 308 may begin comparing the voltage level with the threshold voltage level at a third time 4005 after the second time 4003. For example, the comparator 308 may not compare the voltage level with the threshold voltage level during a time period 4009 between the first time 4001 and the third time 4005, such as to mask any ringing, change in leakage inductance and/or effects of the transformer that may occur due to voltage and/or current variations of at least one of the enable pre-charge signal, the gate of the N1 transistor, the charging current, etc. at the first time 4001 and/or the second time 4003.

As shown by the pre-charge status signal curve 408, a voltage level of the pre-charge status signal (at the output 312 of the comparator 308) may increase (e.g., from a low signal level to a high signal level) at a fourth time 4007. The voltage level of the pre-charge status signal may be increased (by the comparator 308) responsive to the voltage level at the voltage sense input 316 (shown by the voltage sense curve 410) reaching a voltage level 412. The voltage level 412 may be the threshold voltage level at the threshold voltage input 318 of the comparator 308. In some embodiments, the voltage level of the pre-charge status signal increasing (e.g., from the low signal level to the high signal level) may indicate that the capacitor 116 is charged to the threshold charge level and/or may trigger the electric power converter 104 to exit the pre-charge mode and/or enter the energy transfer mode.

As shown by the enable pre-charge signal curve 402, responsive to the voltage level of the pre-charge status signal (at the output 312 of the comparator 308) increasing at the fourth time 4007, the voltage level of the enable pre-charge signal may decrease (e.g., from a high signal level to a low signal level) such as to exit the pre-charge mode and/or enter the energy transfer mode. For example, the controller 120 of the apparatus 100 may generate the enable pre-charge signal based upon the pre-charge status signal. Responsive to the voltage level of the pre-charge status signal increasing at the fourth time 4007, the controller 120 may decrease the voltage level of the enable pre-charge signal (e.g., from the high signal level to the low signal level) to exit the pre-charge mode and/or enter the energy transfer mode. As shown by the N1 gate curve 404, responsive to the voltage level of the pre-charge status signal (at the output 312 of the comparator 308) increasing at the fourth time 4007, the voltage level at the gate of the N1 transistor may decrease (such as to turn off and/or open the N1 transistor). During the energy transfer mode, the N1 transistor may be operated (and/or the voltage level at the gate of the N1 transistor may be controlled) in conjunction with switching cycles performed during the energy transfer mode. As shown by the charging current curve 406, responsive to the voltage level of the pre-charge status signal (at the output 312 of the comparator 308) increasing at the fourth time 4007, the charging current supplied by the current generator 302 may decrease (such as to about 0 amperes).

Figure 5:
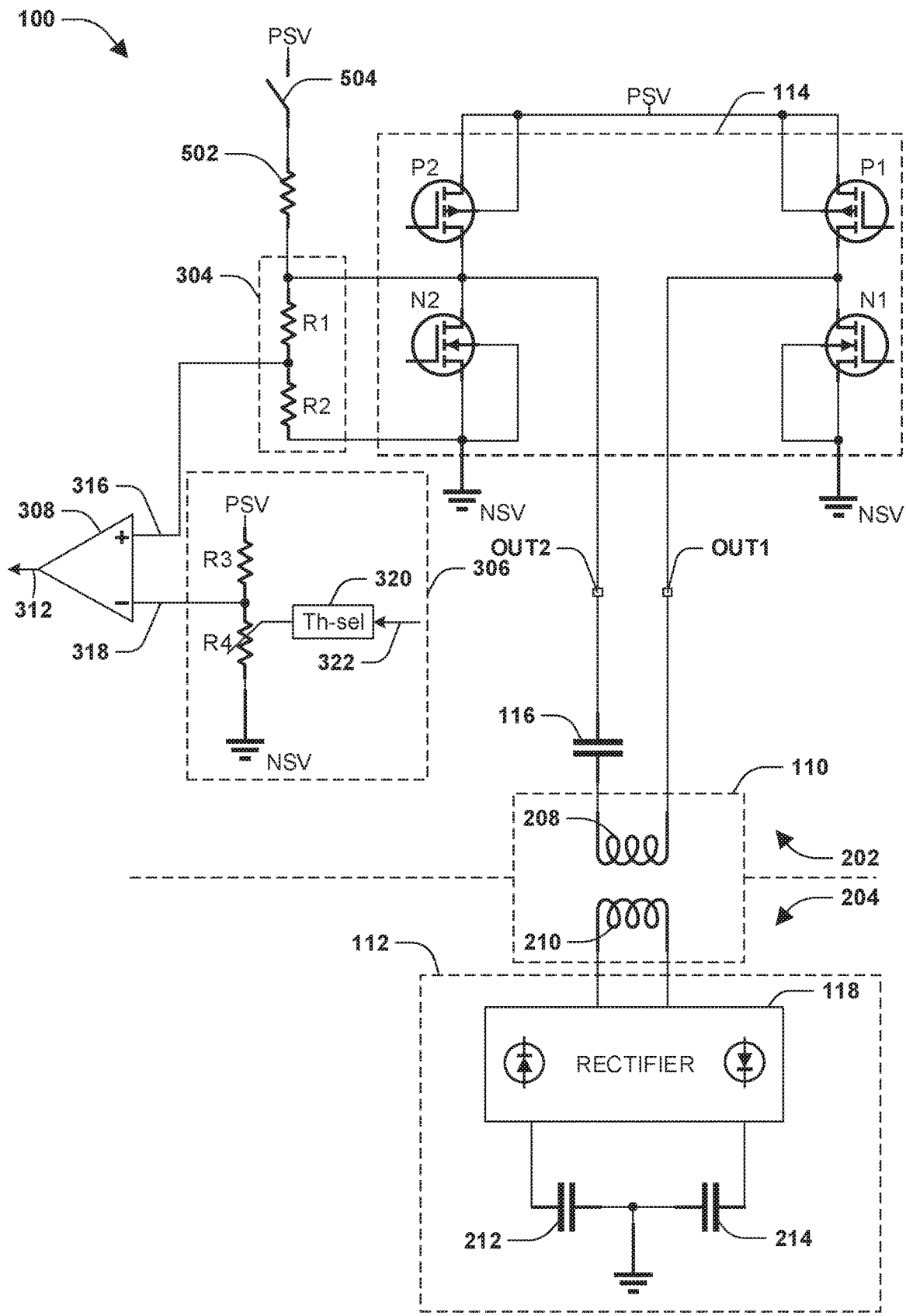
FIG. 5 is a component block diagram illustrating an exemplary apparatus with an electric power converter and pre-charge circuitry comprising a resistor, according to some embodiments.

FIG. 5 illustrates the apparatus 100 according to some embodiments where the pre-charge circuitry 106 comprises a resistor 502 (e.g., a pull up resistor) to charge the capacitor 116. Electrical energy from the power supply 220 may be supplied to the capacitor 116 via the resistor 502 during the pre-charge mode of the electric power converter 104. The N1 transistor of the one or more switches 114 may be in on-state (e.g., closed) during the pre-charge mode to allow the electrical energy to be supplied to and charge the capacitor 116 via the resistor 502. In an embodiment, the apparatus 100 comprises a switch 504 connected to the resistor 502. For example, the switch 504 may be connected in series with the resistor 502, such as between the resistor 502 (e.g., a top terminal of the resistor 502) and the positive terminal (e.g., PSV) of the power supply 220. In some embodiments, the switch 504 is controlled via a signal (e.g., the enable pre-charge signal and/or a different signal) indicating whether the pre-charge mode of the electric power converter 104 is enabled. The switch 504 may be closed when the electric power converter 104 is in the pre-charge mode, thus enabling electrical energy to be supplied to the capacitor 116 via the resistor 502 during the pre-charge mode. The switch 504 may be open when the electric power converter 104 is not in the pre-charge mode (e.g., when the electric power converter 104 is in the energy transfer mode). In some embodiments, the switch 504 may be controlled by circuitry of the apparatus 100, such as at least one of the controller 120 of the apparatus 100, the comparator 308 of the apparatus 100, a timer of the apparatus 100, etc.

Figure 6:
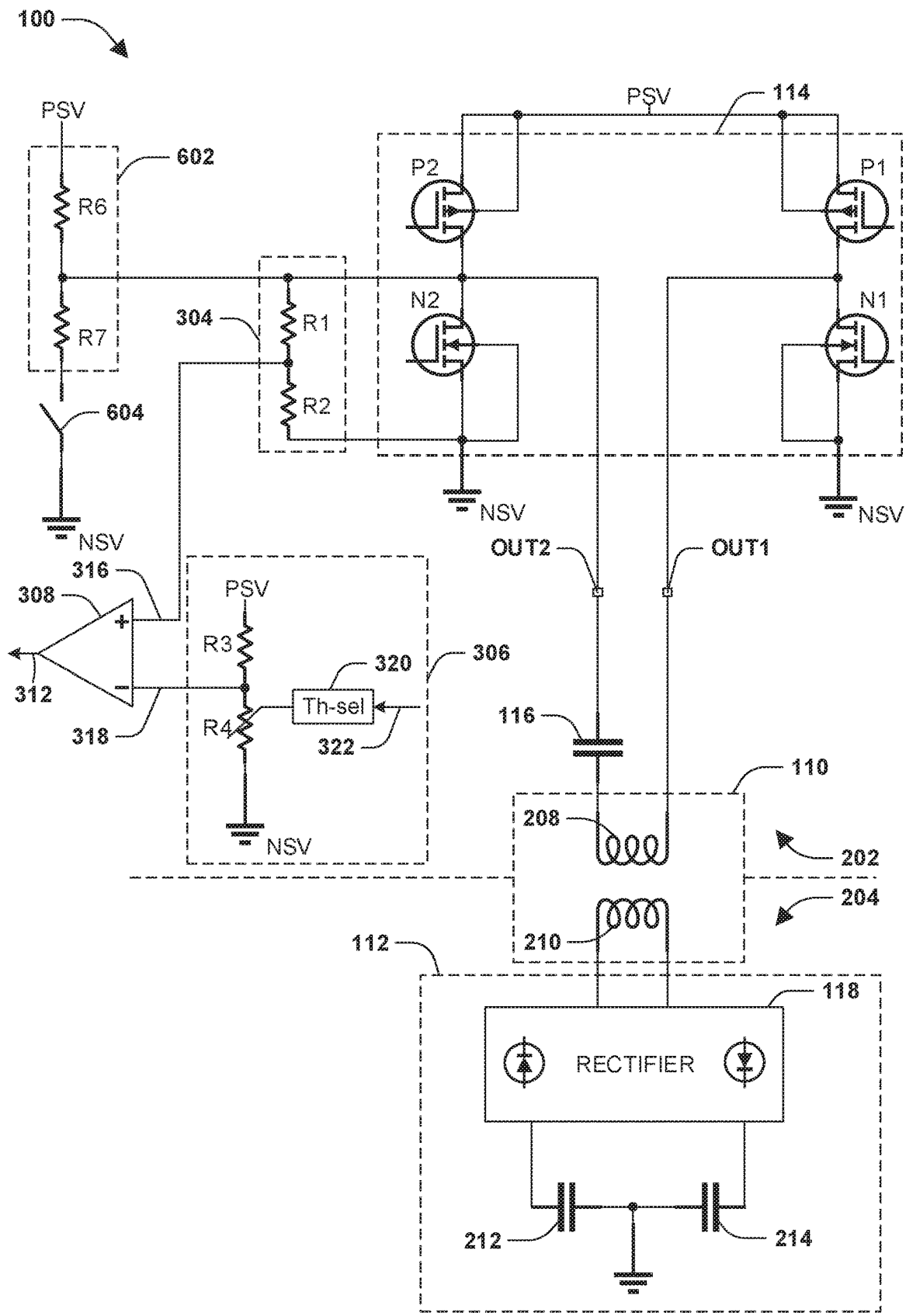
FIG. 6 is a component block diagram illustrating an exemplary apparatus with an electric power converter and pre-charge circuitry comprising a voltage divider, according to some embodiments.

FIG. 6 illustrates the apparatus 100 according to some embodiments where the pre-charge circuitry 106 comprises a voltage divider 602 to charge the capacitor 116. The voltage divider 602 may comprise a resistor R6 and a resistor R7. Electrical energy from the power supply 220 may be supplied to the capacitor 116 via the voltage divider 602 during the pre-charge mode of the electric power converter 104. The N1 transistor of the one or more switches 114 may be in on-state (e.g., closed) during the pre-charge mode to allow the electrical energy to be supplied to and charge the capacitor 116 via the voltage divider 602. In an embodiment, the apparatus 100 comprises a switch 604 connected to the voltage divider 602. For example, the switch 604 may be connected in series with the resistor R7, such as between the resistor R7 (e.g., a bottom terminal of the resistor R7) and the negative terminal (e.g., NSV) of the power supply 220. Alternatively and/or additionally, the switch 604 may be connected between an output of the voltage divider 602 (e.g., the output of the voltage divider 602 between the resistor R6 and the resistor R7) and the capacitor 116 (e.g., the top terminal of the capacitor 116). In some embodiments, the switch 604 is controlled via a signal (e.g., the enable pre-charge signal and/or a different signal) indicating whether the pre-charge mode of the electric power converter 104 is enabled. The switch 604 may be closed when the electric power converter 104 is in the pre-charge mode, thus enabling electrical energy to be supplied to the capacitor 116 via the voltage divider 602 during the pre-charge mode. The switch 604 may be open when the electric power converter 104 is not in the pre-charge mode (e.g., when the electric power converter 104 is in the energy transfer mode). In some embodiments, the switch 604 may be controlled by circuitry of the apparatus 100, such as at least one of the controller 120 of the apparatus 100, the comparator 308 of the apparatus 100, a timer of the apparatus 100, etc.

Figure 7:
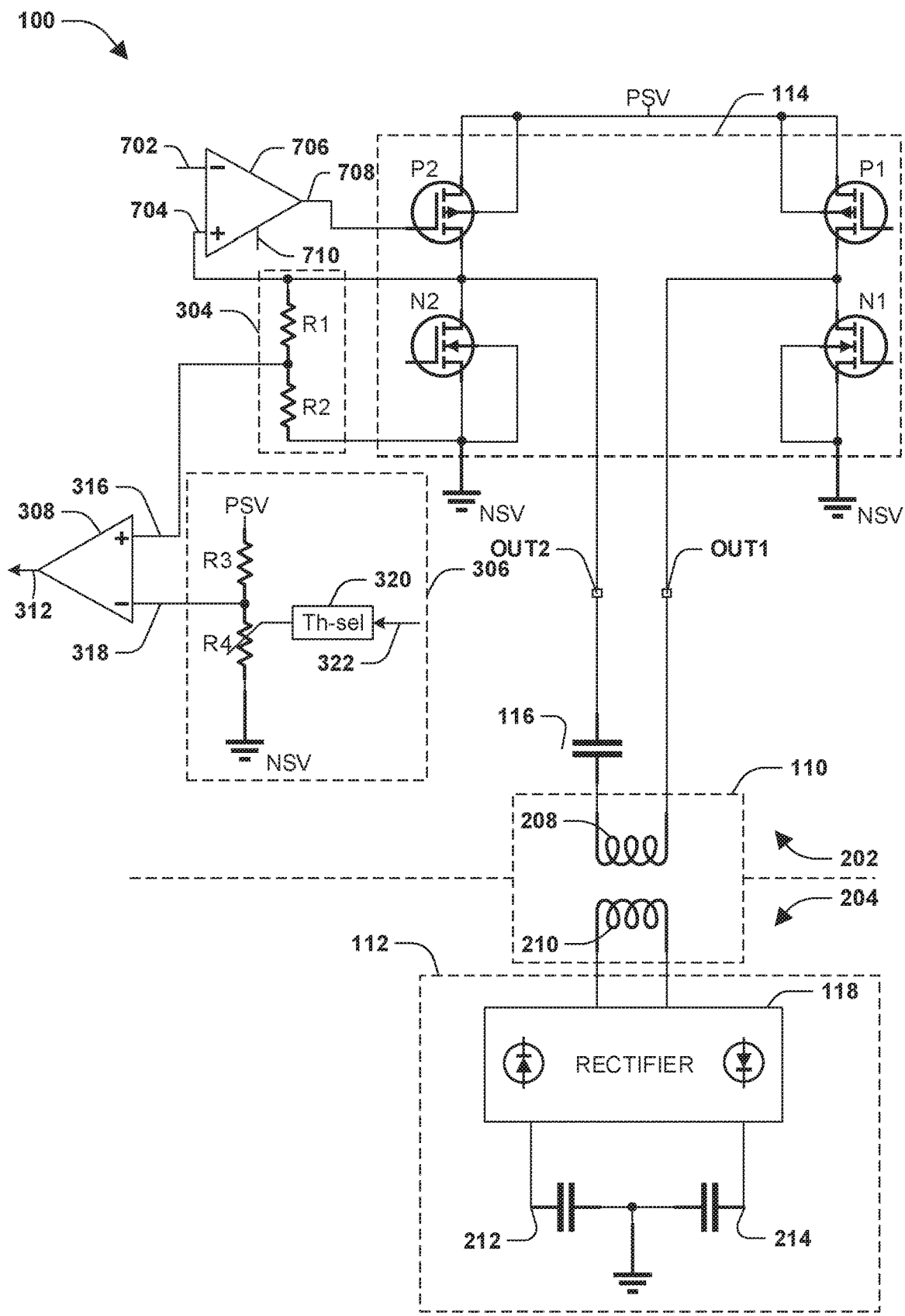
FIG. 7 is a component block diagram illustrating an exemplary apparatus that utilizes a voltage regulator to charge a capacitor of an electric power converter, according to some embodiments.

FIG. 7 illustrates the apparatus 100 according to some embodiments where a voltage regulator is utilized to charge the capacitor 116. In some embodiments, the P2 transistor of the one or more switches 114 may act as the voltage regulator during the pre-charge mode of the electric power converter 104. Electrical energy from the power supply 220 may be supplied to the capacitor 116 via the voltage regulator (e.g., the P2 transistor) during the pre-charge mode. The N1 transistor of the one or more switches 114 may be in on-state (e.g., closed) during the pre-charge mode to allow the electrical energy to be supplied to and charge the capacitor 116 via the voltage regulator (e.g., the P2 transistor). In an embodiment where the P2 transistor acts as the voltage regulator, during the energy transfer mode, the P2 transistor may be operated in conjunction with switching cycles performed during the energy transfer mode. In some embodiments, the apparatus 100 comprises a comparator 706 having a voltage sense input 704 and/or a threshold voltage input 702. The comparator 706 may control the P2 transistor (and/or the N1 transistor) via an output 708 of the comparator 706 such that the P2 transistor is in on-state (e.g., closed) (and/or such that the N1 transistor is in on-state) during the pre-charge mode until a voltage level at the voltage sense input 704 reaches a threshold voltage level at the threshold voltage input 702. In some embodiments, the comparator 706 may have an input 710 corresponding to a signal (e.g., the enable pre-charge signal and/or a different signal) indicating whether the pre-charge mode of the electric power converter 104 is enabled. For example, the signal at the input 710 may control the comparator 706 such that the comparator 706 compares the voltage level at the voltage sense input 704 and the threshold voltage level at the threshold voltage input 702 during the pre-charge mode and/or such that the comparator 706 does not compare the voltage level at the voltage sense input 704 and the threshold voltage level at the threshold voltage input 702 during the energy transfer mode. Alternatively and/or additionally, the signal at the input 710 may control the comparator 706 such that the comparator 706 drives the P2 transistor and/or the N1 transistor (such as to be in on-state) during the pre-charge mode and/or such that the comparator 706 does not drive the P2 transistor and/or the N1 transistor during the energy transfer mode. Alternatively and/or additionally, the controller 120 of the apparatus 100 may control the N1 transistor and the P2 transistor such that the N1 transistor and the P2 transistor are in on-state (e.g., closed) during the pre-charge mode, such as until at least one of the charge level of the capacitor 116 reaches the threshold pre-charge level or the pre-charge time reaches the threshold pre-charge time or the maximum pre-charge time (such as determined by a timer of the apparatus 100).

Figure 8:
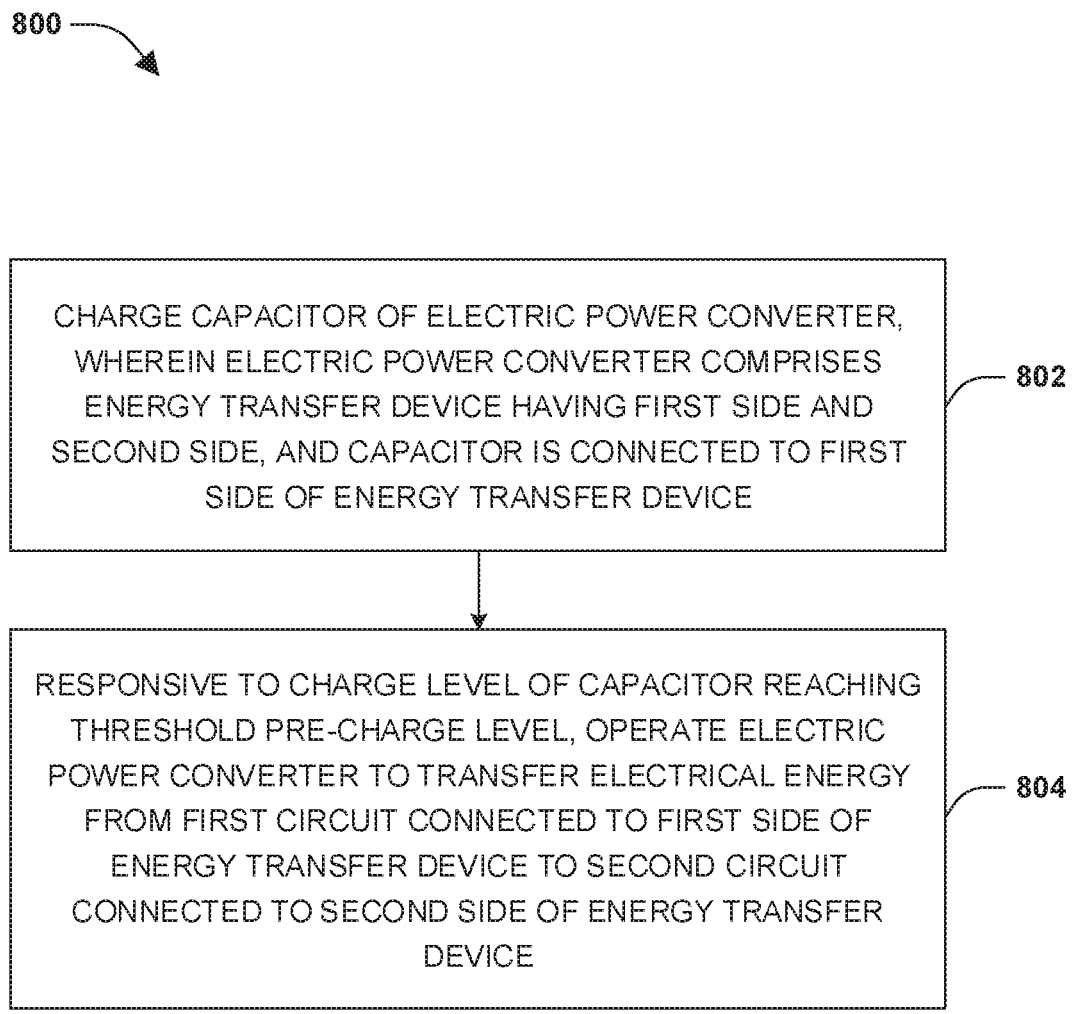
FIG. 8 is an illustration of an example method according to some embodiments.

FIG. 8 is an illustration of a method 800, according to some embodiments. At 802, a capacitor (e.g., the capacitor 116 illustrated in FIGS. 1-3 and 5-7) of an electric power converter (e.g., the electric power converter 104 illustrated in FIGS. 1-3 and 5-7) is charged. The electric power converter comprises an energy transfer device (e.g., the energy transfer device 110 illustrated in FIGS. 1-3 and 5-7) having a first side and a second side. The capacitor is connected to the first side of the energy transfer device. At 804, responsive to a charge level of the capacitor reaching a threshold pre-charge level, the electric power converter is operated to transfer electrical energy from a first circuit (e.g., the first circuit 108 illustrated in FIG. 1) connected to the first side of the energy transfer device to a second circuit (e.g., the second circuit 112 illustrated in FIGS. 1-3 and 5-7) connected to the second side of the energy transfer device.

In some embodiments, the energy transfer device comprises a transformer (e.g., the transformer illustrated in FIGS. 2-3 and 5-7). The first side of the energy transfer device may be a primary side of the transformer (e.g., the primary side 208 illustrated in FIGS. 2-3 and 5-7). The second side of the energy transfer device may be a secondary side of the transformer (e.g., the secondary side 210 illustrated in FIGS. 2-3 and 5-7). The capacitor may be connected in series with the primary side of the transformer.

In some embodiments, the electric power converter is operated by operating one or more switches (e.g., the one or more switches 114 illustrated in FIGS. 1-3 and 5-7) of the first circuit, according to a duty cycle and/or a frequency, to transfer the electrical energy from the first circuit to the second circuit.

In some embodiments, the threshold pre-charge level is generated based upon an input voltage supplied by a power supply (e.g., the power supply 220 illustrated in FIGS. 2-3 and 5-7) to the electric power converter and at least one of the duty cycle or the frequency.

In some embodiments, the capacitor is charged by utilizing a current generator (e.g., the current generator 302 illustrated in FIG. 3) to supply a DC current to the capacitor.

An embodiment of the presently disclosed techniques comprises an apparatus. The apparatus comprises an electric power converter and pre-charge circuitry. The electric power converter comprises a first circuit, a second circuit and an energy transfer device. The first circuit is connected to a power supply. The second circuit is connected to a load. The energy transfer device has a first side connected to the first circuit and a second side connected to the second circuit. The pre-charge circuitry is connected to a capacitor of the first circuit. The capacitor is connected to the first side of the energy transfer device. The pre-charge circuitry is configured to charge the capacitor during a pre-charge mode of the electric power converter. The electric power converter is configured to exit the pre-charge mode and enter an energy transfer mode responsive to at least one of a charge level of the capacitor reaching a threshold pre-charge level or a pre-charge time reaching a threshold pre-charge time.

According to some embodiments, the energy transfer device comprises a transformer, the first side of the energy transfer device is a primary side of the transformer, the second side of the energy transfer device is a secondary side of the transformer, and the capacitor is connected in series with the primary side of the transformer.

According to some embodiments, the electric power converter is configured to transfer electrical energy from the first circuit to the second circuit during the energy transfer mode.

According to some embodiments, the apparatus comprises a controller configured to operate one or more switches of the first circuit, according to at least one of a duty cycle or a frequency, to transfer the electrical energy from the first circuit to the second circuit during the energy transfer mode.

According to some embodiments, the apparatus comprises a comparator with a first input corresponding to the charge level of the capacitor and a second input corresponding to the threshold pre-charge level, wherein the comparator is configured to trigger the electric power converter to exit the pre-charge mode responsive to the charge level of the capacitor reaching the threshold pre-charge level.

According to some embodiments, the threshold pre-charge level corresponds to at least a steady state level of the capacitor.

According to some embodiments, the threshold pre-charge level is based upon an input voltage supplied by the power supply and the duty cycle.

According to some embodiments, the one or more switches are at least one of one or more MOSFETs or one or more IGBTs.

According to some embodiments, the electric power converter is configured to supply a first DC voltage and a second DC voltage to the load.

According to some embodiments, the pre-charge circuitry comprises a current generator configured to supply a current to the capacitor during the pre-charge mode of the electric power converter.

According to some embodiments, the current generator is configured to stop supplying the current to the capacitor responsive to the charge level of the capacitor reaching the threshold pre-charge level.

According to some embodiments, the current is a DC current.

According to some embodiments, the pre-charge circuitry comprises a voltage divider to charge the capacitor.

According to some embodiments, the pre-charge circuitry comprises a voltage regulator to charge the capacitor.

An embodiment of the presently disclosed techniques comprises a method. The method comprises charging a capacitor of an electric power converter. The electric power converter comprises an energy transfer device having a first side and a second side. The capacitor is connected to the first side of the energy transfer device. The method comprises operating, responsive to at least one of a charge level of the capacitor reaching a threshold pre-charge level or a pre-charge time reaching a threshold pre-charge time, the electric power converter to transfer electrical energy from a first circuit connected to the first side of the energy transfer device to a second circuit connected to the second side of the energy transfer device.

According to some embodiments, the energy transfer device comprises a transformer, the first side of the energy transfer device is a primary side of the transformer, the second side of the energy transfer device is a secondary side of the transformer, and the capacitor is connected in series with the primary side of the transformer.

According to some embodiments, operating the electric power converter comprises operating one or more switches of the first circuit, according to at least one of a duty cycle or a frequency, to transfer the electrical energy from the first circuit to the second circuit.

According to some embodiments, the method comprises generating the threshold pre-charge level based upon the duty cycle and an input voltage supplied by a power supply to the electric power converter.

According to some embodiments, charging the capacitor comprises utilizing a current generator to supply a DC current to the capacitor.

An embodiment of the presently disclosed techniques comprises an apparatus. The apparatus comprises a means for charging a capacitor of an electric power converter, wherein the electric power converter comprises an energy transfer device having a first side and a second side, and the capacitor is connected to the first side of the energy transfer device. The apparatus comprises a means for operating, responsive to a charge level of the capacitor reaching a threshold pre-charge level, the electric power converter to transfer electrical energy from a first circuit connected to the first side of the energy transfer device to a second circuit connected to the second side of the energy transfer device.

An embodiment of the presently disclosed techniques comprises an apparatus. The apparatus comprises a DC to DC converter, a comparator and pre-charge circuitry. The DC to DC converter comprises a first circuit, a second circuit and an energy transfer device. The first circuit is connected to a power supply. The second circuit is connected to a load. The energy transfer device has a first side connected to the first circuit and a second side connected to the second circuit. The pre-charge circuitry is connected to a capacitor of the first circuit. The capacitor is connected to the first side of the energy transfer device. The pre-charge circuitry comprises a current generator configured to supply a DC current, to the capacitor during a pre-charge mode of the DC to DC converter, to charge the capacitor. The comparator has a first input corresponding to a charge level of the capacitor and a second input corresponding to a threshold pre-charge level. The comparator is configured to trigger the DC to DC converter to exit the pre-charge mode responsive to the charge level of the capacitor reaching the threshold pre-charge level. The DC to DC converter is configured to transfer electrical energy from the first circuit to the second circuit responsive to exiting the pre-charge mode.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used in this application, the terms "component," "module," "system", "interface", and the like are generally intended to refer to a computer-related entity, either hardware, a combination of hardware and software, software, or software in execution. One or more components may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Various operations of embodiments are provided herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. An apparatus comprising:
    an electric power converter, comprising:
        a first circuit connected to a power supply;
        a second circuit connected to a load; and
        an energy transfer device having a first side connected to the first circuit and a second side connected to the second circuit; and pre-charge circuitry connected to a capacitor of the first circuit, wherein:
the capacitor is connected to the first side of the energy transfer device;
the pre-charge circuitry is configured to charge the capacitor during a pre-charge mode of the electric power converter; and
the electric power converter comprising the first circuit is configured to exit the pre-charge mode and enter an energy transfer mode based upon the capacitor of the first circuit, wherein the exiting the pre-charge mode and the entering the energy transfer mode is responsive to at least one of a charge level of the capacitor of the first circuit reaching a threshold pre-charge level or a pre-charge time reaching a threshold pre-charge time,
wherein:
electrical energy is not transferred from the first circuit to the second circuit during the pre-charge mode, of the electric power converter, exited based upon the capacitor; and
the electric power converter is configured to transfer electrical energy from the first circuit to the second circuit during the energy transfer mode, of the electric power converter, entered based upon the capacitor.

2. The apparatus of claim 1, wherein:
electrical activity in at least one of the first circuit or the pre-charge circuitry does not influence the second circuit during the pre-charge mode.

3. The apparatus of claim 1, wherein:
the pre-charge circuitry is directly connected to the capacitor of the first circuit.

4. The apparatus of claim 1, comprising:
a controller configured to operate one or more switches of the first circuit, according to at least one of a duty cycle or a frequency, to transfer the electrical energy from the first circuit to the second circuit during the energy transfer mode.

5. The apparatus of claim 4, comprising:
a comparator with a first input corresponding to the charge level of the capacitor and a second input corresponding to the threshold pre-charge level, wherein the comparator is configured to trigger the electric power converter to exit the pre-charge mode responsive to the charge level of the capacitor reaching the threshold pre-charge level.

6. The apparatus of claim 1, wherein:
the threshold pre-charge level corresponds to at least a steady state level of the capacitor.

7. The apparatus of claim 4, wherein:
the threshold pre-charge level is based upon an input voltage supplied by the power supply and the duty cycle.

8. The apparatus of claim 4, wherein:
the one or more switches are at least one of one or more metal-oxide-semiconductor field effect transistors (MOSFETs) or one or more insulated-gate bipolar transistors (IGBTs).

9. The apparatus of claim 1, wherein:
the electric power converter is configured to supply a first direct current (DC) voltage and a second DC voltage to the load.

10. The apparatus of claim 1, wherein:
the pre-charge circuitry comprises a current generator configured to supply a current to the capacitor during the pre-charge mode of the electric power converter.

11. The apparatus of claim 10, wherein:
the current generator is configured to stop supplying the current to the capacitor responsive to the charge level of the capacitor reaching the threshold pre-charge level.

12. The apparatus of claim 11, wherein:
the current is a direct current (DC) current.

13. The apparatus of claim 1, wherein:
the pre-charge circuitry comprises a voltage divider to charge the capacitor.

14. The apparatus of claim 1, wherein:
the pre-charge circuitry comprises a voltage regulator to charge the capacitor.

15. A method, comprising:
charging a capacitor of an electric power converter, wherein:
the electric power converter comprises an energy transfer device having a first side and a second side; and
the capacitor is connected to the first side of the energy transfer device; and
responsive to at least one of a charge level of the capacitor reaching a threshold pre-charge level or a pre-charge time reaching a threshold pre-charge time, operating the electric power converter to transfer electrical energy from a first circuit connected to the first side of the energy transfer device to a second circuit connected to the second side of the energy transfer device,
wherein:
electrical energy is not transferred from the first circuit to the second circuit prior to the charge level of the capacitor reaching the threshold pre-charge level or the pre-charge time reaching the threshold pre-charge time.

16. The method of claim 15, wherein:
the energy transfer device comprises a transformer;
the first side of the energy transfer device is a primary side of the transformer;
the second side of the energy transfer device is a secondary side of the transformer; and
the capacitor is connected in series with the primary side of the transformer.

17. The method of claim 15, wherein:
operating the electric power converter comprises operating one or more switches of the first circuit, according to at least one of a duty cycle or a frequency, to transfer the electrical energy from the first circuit to the second circuit.

18. The method of claim 17, comprising:
generating the threshold pre-charge level based upon the duty cycle and an input voltage supplied by a power supply to the electric power converter.

19. The method of claim 15, wherein:
electrical activity in the first circuit does not influence the second circuit prior to the charge level of the capacitor reaching the threshold pre-charge level or the pre-charge time reaching the threshold pre-charge time.

20. An apparatus comprising:
a direct current (DC) to DC converter, comprising:
a first circuit connected to a power supply;
a second circuit connected to a load; and
an energy transfer device having a first side connected to the first circuit and a second side connected to the second circuit;
a comparator; and
pre-charge circuitry connected to a capacitor of the first circuit, wherein:
the capacitor is connected to the first side of the energy transfer device;

the pre-charge circuitry comprises a current generator configured to supply a DC current, to the capacitor during a pre-charge mode of the DC to DC converter, to charge the capacitor;

the comparator has a first input corresponding to a charge level of the capacitor and a second input corresponding to a threshold pre-charge level, wherein the comparator is configured to trigger the DC to DC converter to exit the pre-charge mode based upon the capacitor, wherein the exiting the pre-charge mode is responsive to the charge level of the capacitor reaching the threshold pre-charge level; and the DC to DC converter is configured to transfer electrical energy from the first circuit to the second circuit responsive to exiting the pre-charge mode based upon the capacitor; and electrical energy is not transferred from the first circuit to the second circuit during the pre-charge mode exited based upon the capacitor.

* * * * *